United States Patent
Cox et al.

(10) Patent No.: US 7,167,234 B2
(45) Date of Patent: Jan. 23, 2007

(54) ACTUATOR ASSEMBLY AND LITHOGRAPHIC APPARATUS COMPRISING SUCH AN ACTUATOR ASSEMBLY

(75) Inventors: Henrikus Herman Marie Cox, Eindhoven (NL); Sven Antoin Johan Hol, Eindhoven (NL); Hernes Jacobs, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 171 days.

(21) Appl. No.: 10/967,306

(22) Filed: Oct. 19, 2004

(65) Prior Publication Data

US 2006/0082753 A1    Apr. 20, 2006

(51) Int. Cl.
*G03B 27/58* (2006.01)
*G03B 27/62* (2006.01)
(52) U.S. Cl. .......................................... 355/72; 355/75
(58) Field of Classification Search .................. 355/72, 355/75; 310/10, 12, 14
See application file for complete search history.

(56) References Cited

U.S. PATENT DOCUMENTS

| | | | | |
|---|---|---|---|---|
| 5,719,451 | A * | 2/1998 | Cook et al. | 310/12 |
| 6,445,093 | B1 * | 9/2002 | Binnard | 310/12 |
| 6,717,296 | B2 * | 4/2004 | Hol et al. | 310/12 |
| 6,906,789 | B2 * | 6/2005 | Carter et al. | 355/75 |
| 2002/0000904 | A1 * | 1/2002 | Compter et al. | 335/229 |

* cited by examiner

*Primary Examiner*—Rodney Fuller
(74) *Attorney, Agent, or Firm*—Pillsbury Winthrop Shaw Pittman, LLP

(57) ABSTRACT

An actuator assembly includes a coil moveably positionable in a magnetic field generated by a magnet assembly, each of the coil and the magnet having substantially only one side facing the other. A magnetized field-shaping element is provided for shaping the magnetic field such that the magnetic field is substantially perpendicular to the direction of the electrical current for generating a force in a first degree of freedom. Thus, the coil may easily be mounted, since it does not need to be enclosed by magnet poles.

17 Claims, 3 Drawing Sheets

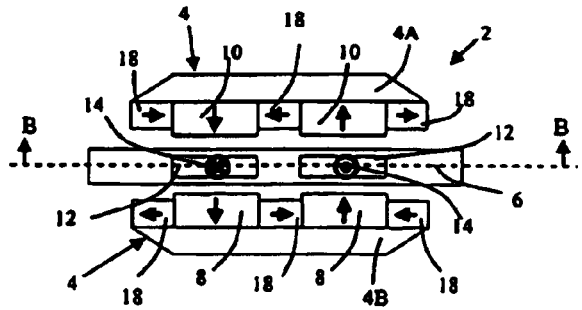
Fig. 2A
PRIOR ART
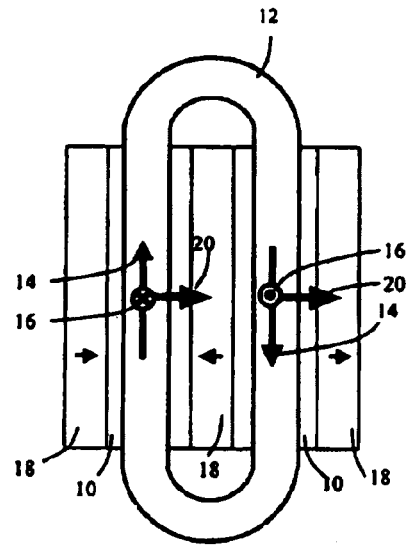
Fig. 2B
PRIOR ART
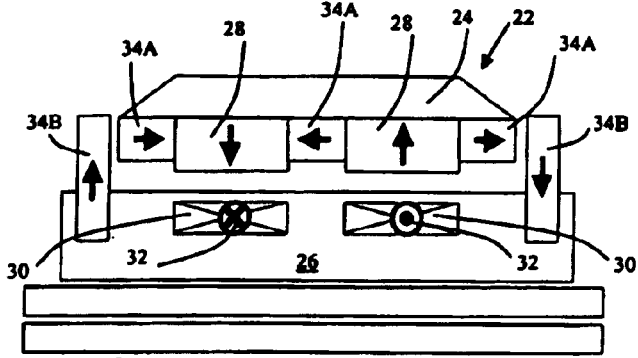
Fig. 3A
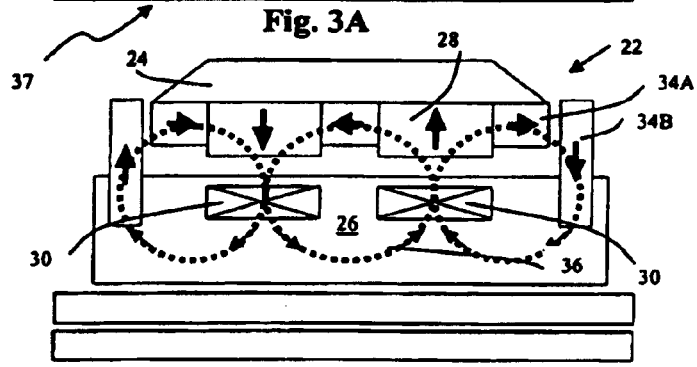
Fig. 3B
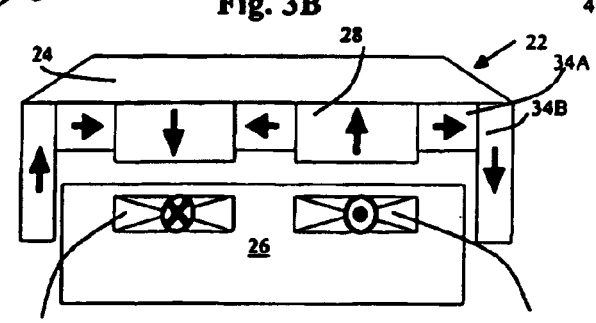
Fig. 3C
Fig. 4

ACTUATOR ASSEMBLY AND LITHOGRAPHIC APPARATUS COMPRISING SUCH AN ACTUATOR ASSEMBLY

FIELD

The present invention relates to an actuator assembly and a lithographic apparatus comprising such an actuator assembly.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Conventional lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

For scanning or stepping, the patterning device and/or the substrate need to be moveably supported. In a conventional lithographic apparatus, a patterning support and/or a substrate table are supported by an actuator assembly which includes a first and a second actuator part. In a conventional actuator assembly, the first actuator part includes two magnets for generating a magnetic field in a gap between the magnets. A second actuator part includes a coil, which coil is positioned in the gap between the magnets in order to position the coil in the magnetic field. Thus, the magnets of the first actuator part are positioned on opposite sides of the coil of the second actuator part.

Since the magnets of the first actuator part are positioned on opposite sides of the second actuator part, assembling and mounting of the actuator assembly may be difficult. If the actuator assembly malfunctions, it may be necessary to disassemble the actuator assembly, i.e. dismounting at least one of the actuator parts, for inspection, repair or replacement. Thereafter, the assembly has to be assembled and mounted again. Disassembling and assembling an actuator assembly in a lithographic apparatus is even more complicated than the initial assembling and mounting, since the actuator assembly is then surrounded by a number of other parts of the lithographic apparatus, limiting the working space. Disadvantageously, it may therefore be needed to design the lithographic apparatus such that extra space around the actuator assembly is provided for easy accessibility, inspection and fast repair.

SUMMARY

Embodiments of the invention include an actuator assembly, which is easy to assemble and disassemble, and to mount and dismount.

According to an embodiment of the invention, there is provided a lithographic apparatus arranged to transfer a pattern from a patterning device onto a substrate, wherein at least one of the patterning device and the substrate is moveably supported by an actuator assembly, the actuator assembly including a first actuator part moveably positionable with respect to a second actuator part, the first actuator part including a plurality of magnets for generating a magnetic field; and the second actuator part including an electrical conductor positionable in the magnetic field for conducting an electrical current in a second direction through the magnetic field; the magnetic field being shaped to be, at least at the location of the electrical conductor, in a first direction substantially perpendicular to the second direction of the electrical current for generating a force on the electrical conductor in a first degree of freedom perpendicular to a plane defined by the first and second directions, wherein the first actuator part, including all magnets thereof, and the second actuator part are moveable away from each other in the first direction.

According to an embodiment of the invention, there is provided an actuator assembly including a first actuator part moveably positionable with respect to a second actuator part, the first actuator part including a plurality of magnets for generating a magnetic field; and the second actuator part including an electrical conductor positionable in the magnetic field for conducting an electrical current in a second direction through the magnetic field; the magnetic field being shaped to be, at least at the location of the electrical conductor, in a first direction substantially perpendicular to the second direction of the electrical current for generating a force on the electrical conductor in a first degree of freedom perpendicular to a plane defined by the first and second directions, wherein the first actuator part, including all magnets thereof, and the second actuator part are moveable away from each other in the first direction.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2A shows a schematic side view of a conventional actuator assembly;

FIG. 2B shows a schematic sectional view of the conventional actuator assembly of FIG. 2A;

FIG. 3A schematically shows a side view of an actuator assembly according to an embodiment of the present invention;

FIG. 3B shows the side view of FIG. 3A schematically indicating a magnetic field generated in the actuator assembly;

FIG. 3C schematically shows a side view of an actuator assembly according to another embodiment of the present invention;

FIG. 4 illustrates a principle of generating a gravity compensation force using Halbach magnets;

DETAILED DESCRIPTION

Figure 1:
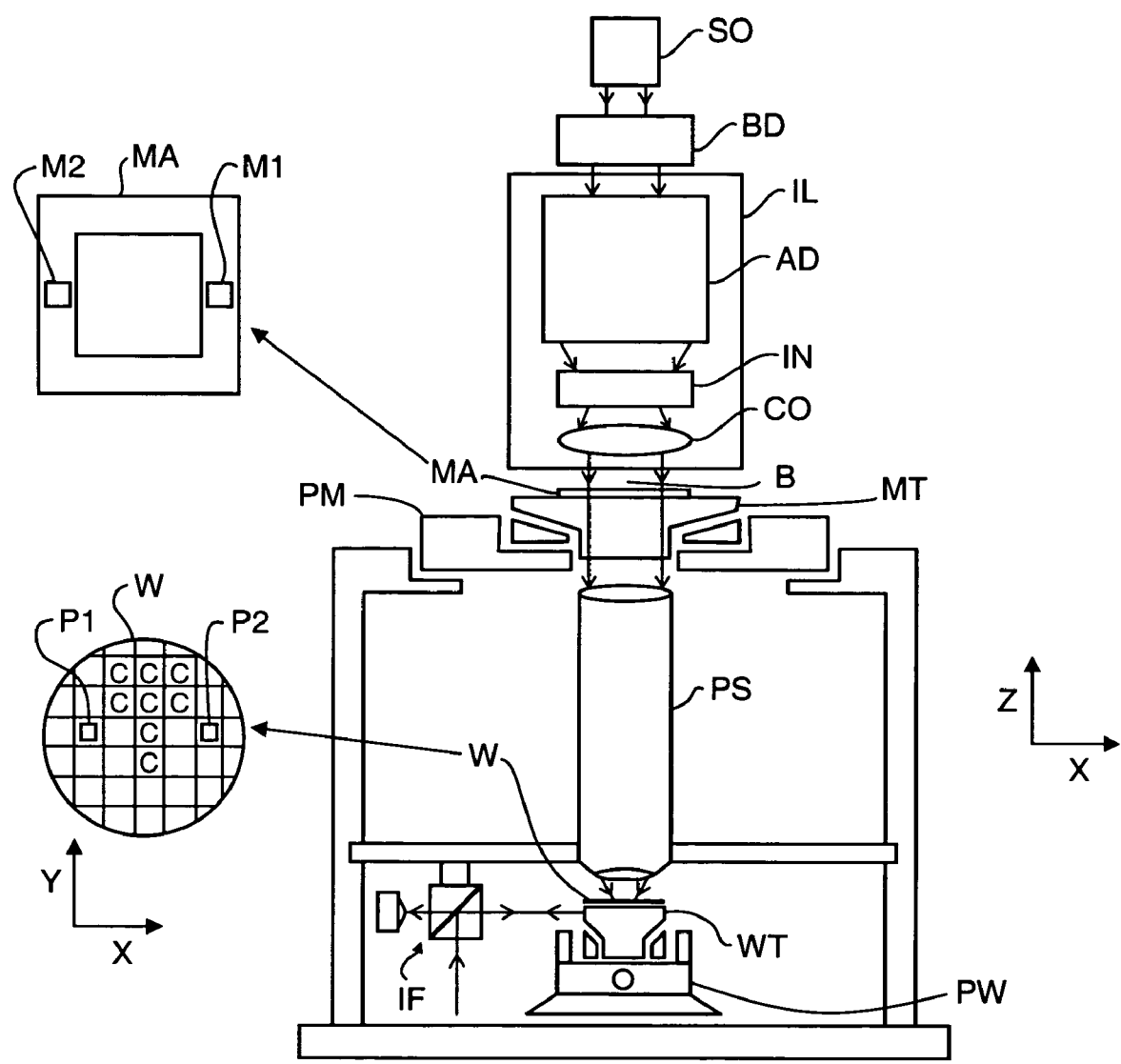
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation), a support structure (e.g. a mask table) MT constructed to support a patterning device (e.g. a mask) MA and connected to a first positioner PM configured to accurately position the patterning device in accordance with certain parameters, and a substrate table (e.g. a wafer table) WT constructed to hold a substrate (e.g. a resist-coated wafer) W and connected to a second positioner PW configured to accurately position the substrate in accordance with certain parameters. The apparatus also includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

Step mode: the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode: the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

FIG. 2A schematically illustrates a conventional actuator assembly 2 for moving a pattern support or a substrate table. The actuator assembly includes a generally C-shaped first actuator part 4 of which two arms are indicated by reference numerals 4A and 4B. The arms 4A and 4B are connected to each other in a manner not shown in FIG. 2A. Each arm 4A, 4B is provided with two magnets 10, 8 respectively, thereby generating a magnetic field between each pair of magnets 8, 10 essentially in the directions of the arrows drawn in each of the magnets 8, 10.

Between the two arms 4A, 4B of the C-shaped first actuator part, a second actuator part 6 is positioned. The second actuator part 6 is provided with a coil 12 of which a first branch and a second branch are positioned in the magnetic field between the magnets 8, 10. A current 14 may be generated in the coil 12. The magnetic field may be guided and locally enforced by magnetized field-shaping elements 18, e.g. Halbach magnets.

FIG. 2B shows a sectional view through the line B—B in FIG. 2A. The coil 12 is positioned in a magnetic field 16 generated by the magnets 10. The orientation of the magnetic field 16 is opposite for each branch of the coil 12. Also, the orientation of the current 14 through each branch of the coil 12 is opposite to each other. Therefore, an orientation of each force 20, generated in each branch of the coil 12 due to the current 14 through magnetic field 16, is the same. Hence, the coil 12 and the magnets 10, 8 may move with respect to each other due to the generated force 20.

The position of the second actuator part 6 in between the arms 4A, 4B of the first actuator part results in complicated assembling and/or mounting a lithographic apparatus and, if the actuator assembly ever malfunctions, disassembling and thereafter assembling again may be even more complicated. Further, the opposing magnets may generate considerable attracting forces, which need to be compensated.

The actuator assembly 2 includes additional actuating devices (not shown) that are configured to position the second actuator part 6 with respect to the first actuator part 4 and, depending on the orientation of mounting, for compensating the force of gravity. These additional actuating devices make the actuator assembly even more complicated to assemble and make the actuator assembly relatively expensive due to the additional components.

FIG. 3A schematically illustrates an actuator assembly 22 according to an embodiment of the present invention. The actuator assembly 22 includes a first actuator part 24 and a second actuator part 26. The first actuator part is provided with two magnets 28 and with magnetized field-shaping elements 34A such as Halbach magnets therebetween to guide and enforce the magnet flux. The magnets 28 may be permanent magnets or any other kind of magnets such as electromagnets, for example, generating a magnetic field essentially in the directions of the arrows drawn in each of the magnets 28.

The second actuator part 26 is provided with a coil 30 having two branches. Each branch is positioned in the magnetic field generated by the magnets 28 such that if a current 32 is generated in the coil 30, a force is generated between each pair of a magnet 28 and a branch of the coil 30. To generate a force similar to the force generation as explained in relation to FIG. 2B, the magnetic flux needs to be directed perpendicular to the current 32 similar to the magnetic flux generated in the prior art actuator assembly 2 of FIG. 2A. Contrary to the assembly of FIG. 2A, in the embodiment of the invention shown in FIG. 3A, the first actuator part 24 and the second actuator 26 part have substantially only one side facing the other actuator part. Thus, the first actuator part 24 is moveable away from the second actuator part 26 in a direction substantially perpendicular to a plane of the side without requiring complicated handling.

Referring to FIG. 3B, the magnetic flux 36 may be shaped using magnetized field-shaping elements 34B. The magnetized field-shaping elements 34B guide the magnet flux such that a generated magnetic flux becomes more concentrated in the branches of the coil 30 which is similar to the magnetic flux generated between the magnets 8, 10 in the prior art actuator assembly of FIG. 2A. Thus, no magnets are needed at the opposite side of the coil 30, and hence the first actuator part is not required to have a C-shape. Each actuator part thus has substantially only one side opposing the other actuator part, instead of one actuator part having two opposing sides each facing the other actuator part, like in the prior art. In FIGS. 3A–B, a second actuator assembly 37 is configured to support and move the first actuator part 24 and the second actuator part 26 of the actuator assembly 22 over relatively long distances.

FIG. 3C illustrates an actuator assembly 22 according to an embodiment of the present invention. Contrary to the embodiment illustrated in FIG. 3A, the magnetized field-shaping elements 34B are provided on the first actuator part 24. The embodiment of FIG. 3A, however, may be preferred as is explained in relation to FIG. 4 hereinafter.

FIG. 4 shows how a net upwards force 48 can be obtained using attractive and repellent forces from three magnets 40, 42 and 44. In FIG. 4, triangular arrowheads indicate a direction of magnetic flux. The enclosed magnet 42 is attracted by the magnetic flux 46 leaving top of magnet 40 and entering the left side of magnet 42. The flux 46 leaving magnet 42 and the flux 46 entering the top of magnet 44 generate an attracting force. At the bottom of magnets 40 and 44 the magnetic flux 46 generates repellent forces between the magnets 40 and 42 and between the magnets 42 and 44. The magnetic flux 46 entering the bottom of magnet 40 is repelled by the magnetic flux 46 entering the left side of magnet 42. The flux 46 leaving magnet 42 at the right side is repelled by the flux 46 leaving the bottom of magnet 44. So, by this configuration of magnets 40, 42, 44, there is an upward attracting force at the top and a repellent upward force at the bottom of magnet 42. The resulting force 48 may be advantageously be employed for compensating a gravity force in the embodiments of FIGS. 3A and 3B. For example, in FIG. 3A, the magnetized field-shaping elements 34B provide the function of magnets 40 and 44 shown in FIG. 4, and magnetized field shaping elements 34A (FIG. 3A) provide the function of the magnet 42 in FIG. 4.

Referring to FIGS. 3A and 3B, the first actuator part 24 is positioned between two magnetized field-shaping elements 34B. The magnetic flux 36 is generated such that the first actuator part 24 tends to move to a predetermined position with respect to the second actuator part 26 as explained above in relation to FIG. 4. However, if the first and the second actuator part 24, 26 are substantially vertically positioned with respect to each other, the force of gravity exerted on the first actuator part 24 may counteract. In such a case, said force of gravity exerted on the first actuator part 24 may at least partly be compensated by the magnetized field-shaping elements 34A and 34B.

Figure 5A:
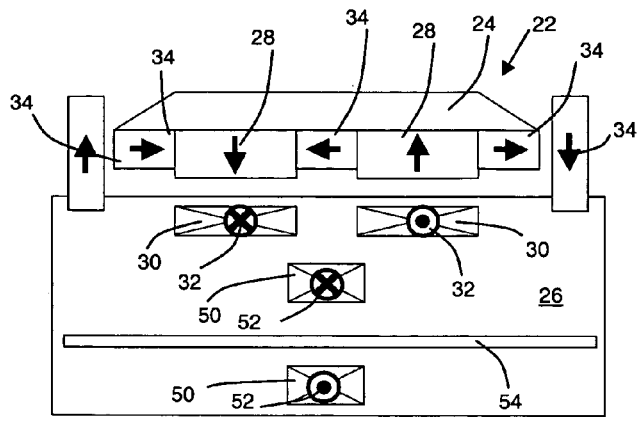
FIG. 5A schematically shows an actuator assembly in accordance with an embodiment of the present invention.

FIG. 5A illustrates an actuator assembly according to a further embodiment of the present invention. The actuator assembly 22 includes a first actuator part 24 and a second actuator part 26. The first actuator part 24 includes two magnets 28 and magnetized field-shaping elements 34. The second actuator part 26 includes a coil 30 and field-shaping elements 34. The first actuator part 24 may hover above the second actuator part 26 as described above.

In the embodiment of the invention shown in FIG. 5A, the second actuator part 26 is further provided with a second coil 50 that is configured to conduct a second electrical current 52. Shielding material 54, such as mu-metal, for shielding the magnetic field is positioned between a first and a second branch of the coil 50. The shielding material 54 prevents that an undesired force is generated when a current flows through the lower branch of the coil 50, and the shielding material 54 prevents that a magnetic field generated by the magnets 28 is disturbed by any other nearby structure. Shielding material may also be present at other locations of the actuator assembly 22 or in the surroundings of the actuator assembly 22.

Figure 5B:
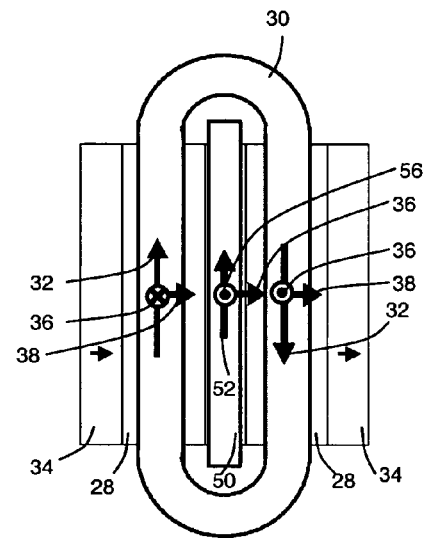
FIG. 5B shows a sectional view of the embodiment of FIG. 5A.
Figure 5C:
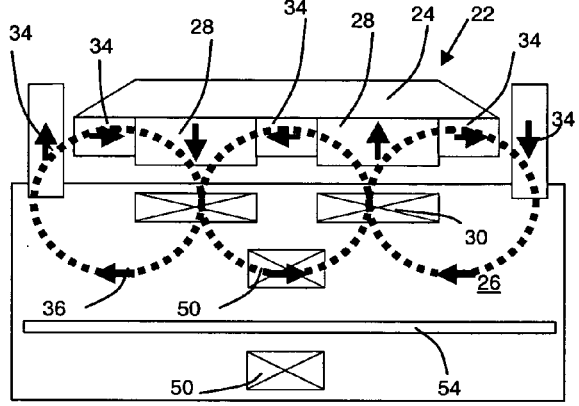
FIG. 5C shows the side view of FIG. 5A schematically indicating a magnetic field generated in the actuator assembly.

Functioning of the actuator assembly 22 of FIG. 5A is described in relation to FIGS. 5B and 5C. Referring to FIG. 5C, a magnetic field 36 is generated by the magnets 28 and guided by the field-shaping elements 34 such that a vertical magnetic flux is present in the area of the branches of the coil 30. As illustrated in FIG. 5B and as above described in relation to FIG. 2B, a horizontal force 38 may be generated by generating a current 32 through the coil 30. The second coil 50 is positioned such that a horizontally directed magnetic flux is present in the area of an upper coil branch and no magnetic flux is present in the area of a lower coil branch, e.g. enforced by shielding material 54. In another embodiment of the invention illustrated in FIG. 5D, the second branch of the coil 50 may be positioned essentially outside the magnetic field 36.

Due to the orientation of the magnetic flux in the area of the upper branch of the coil 50, and the orientation of the current 52 through the branch of the coil 50, a vertical force 56 may be generated. Thus, in this embodiment, the first actuator part 24 and the second actuator part 26 may be controlled to move horizontally and vertically with respect to each other.

Figure 5E:
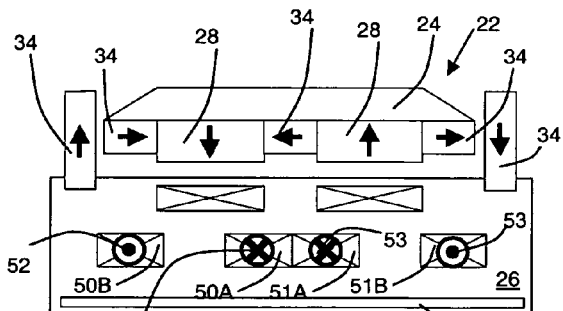
FIG. 5E schematically shows a side view of an actuator assembly in accordance with an embodiment of the present invention.
Figure 5D:
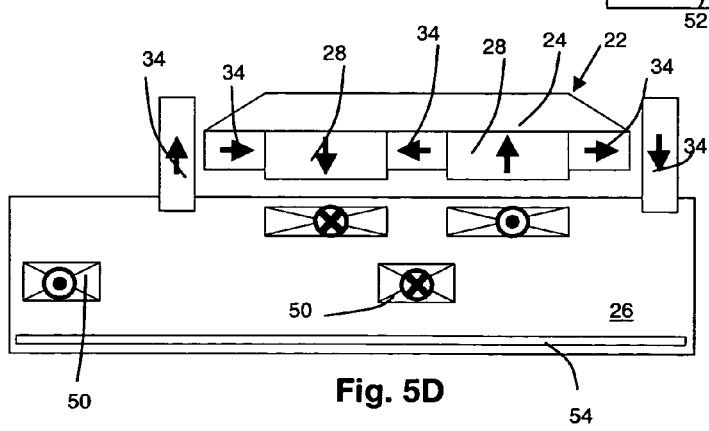
FIG. 5D schematically shows a side view of an actuator assembly in accordance with another embodiment of the present invention.

As shown in FIG. 5C, the direction of the magnetic flux 36 (FIG. 5C) varies in a plane below a plane defined by coil 30. The variation of the direction of the magnetic flux may advantageously be employed for generating vertical forces. A further embodiment of the invention including a first and a second coil 50, 51 in the plane is illustrated in FIG. 5E. In FIG. 5E the first coil 50 has a first branch 50A and a second branch 50B and the second coil 51 has a first branch 51A and a second branch 51B. The first branches 50A and 51A are positioned next to each other such that the direction of the magnetic flux is substantially identical for said branches 50A and 51A. The second branches 50B and 51B are positioned such that the direction of the magnetic flux is substantially identical for said branches 50B and 51B and substantially opposite to the direction of the magnetic flux at the position of the first branches 50A and 51A.

A direction of a current 52, 53 flowing through the first branches 50A, 51A, respectively, is substantially identical. Likewise, a direction of the current 52, 53 flowing through the second branches 50B, 51B, respectively, is substantially identical and substantially opposite to the direction of the current 52, 53 through the first branches 50A and 51A. In the configuration illustrated in FIG. 5E, the forces generated in the four branches 50A, 50B, 51A and 51B all have substantially identical directions, and thus enable to control the first actuator part 24 and the second actuator part 26 to move vertically with respect to each other.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus configured to transfer a pattern from a patterning device onto a substrate, comprising:
   an actuator assembly configured to position the patterning device or the substrate, said actuator assembly comprising:
      a first actuator part comprising a plurality of magnets configured to generate a magnetic field; and
      a second actuator part comprising an electrical conductor positionable in said magnetic field and configured to conduct an electrical current in a second direction through said magnetic field, said first actuator part being moveably positionable with respect to said second actuator part,
   wherein said magnetic field is shaped to be, at least at a location of said electrical conductor, in a first direction substantially perpendicular to said second direction of said electrical current so as to generate a force on said electrical conductor in a first degree of freedom substantially perpendicular to a plane defined by said first and second directions, and
   wherein the first actuator part, including all magnets thereof, and the second actuator part are moveable away from each other in said first direction.

2. The lithographic apparatus of claim 1, wherein the actuator assembly comprises a magnetized field-shaping element configured to shape said magnetic field.

3. The lithographic apparatus of claim 2, wherein said magnetized field-shaping element is arranged in said first actuator part.

4. The lithographic apparatus of claim 2, wherein said magnetized field-shaping element is arranged in said second actuator part.

5. The lithographic apparatus of claim 1, wherein each of the first and second actuator parts has substantially only one side facing the other actuator part, said side extending substantially perpendicular to said first direction.

6. The lithographic apparatus of claim 1, further comprising:
   an illumination configured to condition a beam of radiation;
   a support structure configured to support the patterning device;
   a projection system configured to project the pattern from the patterning device onto the substrate; and
   a substrate table configured to hold the substrate.

7. The lithographic apparatus of claim 1, wherein said plurality of magnets is arranged in said first actuator part so as to space apart said first actuator part from said second actuator part in said first direction.

8. An actuator assembly comprising:
   a first actuator part comprising a plurality of magnets that are configured to generate a magnetic field; and
   a second actuator part comprising an electrical conductor positionable in said magnetic field and configured to conduct an electrical current in a second direction through said magnetic field, said first actuator part being moveably positionable with respect to said second actuator part;
   wherein said magnetic field is shaped to be, at least at the location of said electrical conductor, in a first direction, substantially perpendicular to said second direction of said electrical current so as to generate a force on said electrical conductor in a first degree of freedom substantially perpendicular to a plane defined by said first and second directions, and
   wherein the first actuator part, including all magnets thereof, and the second actuator part are moveable away from each other in said first direction.

9. The actuator assembly of claim 8, wherein the actuator assembly comprises a magnetized field-shaping element configured to shape said magnetic field.

10. The actuator assembly of claim 8, wherein each of the first and second actuator part has substantially only one side facing the other actuator part, which side extends substantially perpendicular to said first direction.

11. The actuator assembly of claim 8, wherein the conductor forms part of a coil.

12. The actuator assembly of claim 8, wherein a second electrical conductor is provided for generating a force in a second degree of freedom.

13. The actuator assembly of claim 9, wherein a first of the first actuator part and the second actuator part is substantially vertically positioned above a second of the first actuator part and the second actuator part, said second of said first actuator part and said second actuator part being supported by a support structure, and the magnetic field shaping element being configured to generate a vertical gravity compensation force to support said first of said first actuator part and said second actuator part.

14. The actuator assembly of claim 9, wherein the magnetized field-shaping element is a Halbach magnet.

15. The actuator assembly of claim 8, wherein the actuator assembly is provided with magnetic field shielding material that is configured to prevent undesirable magnetic interaction with another structure.

16. The actuator assembly of claim 15, wherein the magnetic field shielding material is positioned between the magnet of the first actuator part and an electrical conductor, which is configured to conduct an electrical current, to prevent generation of an undesired force.

17. The actuator assembly of claim 8, wherein the actuator assembly is configured to move over a relatively short distance, and wherein said first or second actuator part is supported by a second actuator assembly configured to move over relatively long distances.

* * * * *